Figure 1:
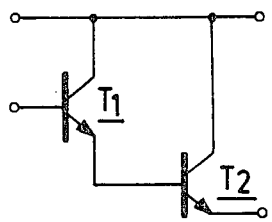

United States Patent [19]

Bonis

[11] 4,078,244

[45] Mar. 7, 1978

[54] SEMICONDUCTOR DEVICE

[75] Inventor: Maurice Bonis, Herouville, France

[73] Assignee: U.S. Philips Corporation, New York, N.Y.

[21] Appl. No.: 660,499

[22] Filed: Feb. 23, 1976

[30] Foreign Application Priority Data

Feb. 28, 1975  France ............................ 75 06360

[51] Int. Cl.² .................... H01L 27/02; H01L 27/04; H01L 29/06
[52] U.S. Cl. ........................................ 357/46; 357/49; 357/48; 357/50; 357/55
[58] Field of Search ...................... 357/46, 47, 48, 50, 357/55

[56] References Cited

U.S. PATENT DOCUMENTS

| 3,596,150 | 7/1971 | Berthold et al. | 357/46 |
| 3,936,856 | 2/1976 | Magdo | 357/50 |

Primary Examiner—Edward J. Wojciechowicz
Attorney, Agent, or Firm—Frank R. Trifari

[57] ABSTRACT

A semiconductor device having two transistors which have a common collector.

The device is characterized in that the distance between the two base zones is such that during operation of the device the depletion zones of the base-collector junctions merge into each other. Application to the manufacture of photo-Darlington devices.

8 Claims, 11 Drawing Figures

SEMICONDUCTOR DEVICE

The invention relates to a semiconductor device with a semiconductor body having at least two transistors with a common collector zone of a first conductivity type in which the base zones of both transistors are provided.

The invention relates in particular to devices which are referred to as "PHOTO-DARLINGTONS" and which comprise a phototransistor which is coupled to an amplifying transistor according to an assembly of the Darlington type (in this assembly the two transistors essentially are of the same type (both npn or pnp) while their collector zones are connected to the same voltage terminal, the emitter zone of the phototransistor being connected directly to the base zone of the amplifying transistor).

It is known that photo-Darlington devices can be used for various applications, for example, for switching on or off electric devices, for example relays, in accordance with certain illumination levels of the photo-transistor. In the case of applications of this nature, the transistors are subjected to high voltages in the order of magnitude of the voltages of the distribution networks, and even to voltages which are considerably higher than said voltages if peak voltages are taken into account.

The realization of integrated photo-Darlington devices which withstand such voltages results in problems which are difficult to solve in the present prior art.

According to a simple and frequently used embodiment the base zones of the transistors are obtained by forming two diffused zones from the active surface of a semiconductor plate which also forms the common collector zone of the device; the two emitter zones are also formed by a localized diffusion within the boundaries of the said base zones. The direct electric connection between the emitter zone of the phototransistor and the base zone of the amplifying transistor is obtained simply by providing a metal strip which is provided on an insulating layer. On the other hand, however, the strong curvature of the base-collector junction at the edge of the base zones causes strong electric fields to be present at that area; as a result of this the breakdown voltage between the base zones and the collector zone is already achieved as soon as the nominal voltage between said regions reaches a value of approximately 300 Volts. This 300 V value thus forms the limit for the voltage to be used in said devices.

For increasing the voltage limit it was already suggested to eliminate such edge curvature in the diffused base zones. According to the method used for this purpose, first a single diffused zone having a large area is formed in the semiconductor plate and two parts are then insulated in said zone and each forms a base zone; this is done by providing insulating grooves in the direction of the thickness of the semiconductor plate. In this manner a structure of the "mesa-type" is obtained which has the advantage of being capable of withstanding between the base zones and the collector zone voltages which may exceed 1000 Volts. For that reason, however, the connection between the emitter zone of the phototransistor and the base zone of the amplifying transistor can be obtained only by a wire, which means a drawback in the manufacture and the reliability of the device; on the other hand, in the last-mentioned embodiment the leakage currents are considerably larger than those occurring in the preceding embodiment.

It is the object of the invention to manufacture integrated devices having at least two transistors, of which one is an amplifying transistor, which show the advantages of the two structures without, however, showing the drawbacks thereof.

The invention makes a particularly advantageous use of the expansion of the depletion zone of the base-collector junctions.

According to the invention, a semiconductor device of the kind mentioned in the preamble is characterized in that the two base zones are separated over at least a part of their oppositely located edges by a strip-shaped region of semiconductor material of the first conductivity type, the width of said strip-shaped region being chosen to be such that in the operating condition the depletion zones of the two base-collector junctions merge one into the other, the two base zones beyond the said strip-shaped region and throughout the remaining part of their edge being bounded by the wall of a groove which has a larger depth than the base-collector junctions.

By merging into each other the depletion zones of the base-collector junctions, the effect of considerable edge curvatures is avoided and the advantages of a mesa structure are reached as regards the withstanding of high voltages.

The achieved breakdown voltages are of the same order of magnitude (at least 1000 V) as those obtained with devices of the mesa type.

For a given device and as a function of the operating voltages the optimum width of the strip-shaped region should be determined for each individual application, said width furthermore depending on the resistance of the material of the first conductivity type forming the said region. In accordance with the application, the width, preferably measured at the surface of the device, is from 10 to 120 $\mu$. As regards a photo-Darlington device for which the said resistance should be determined within limit values which are compatible with a maximum sensitivity of the photo transistors, the width of the said strip-shaped region preferably is from 10 $\mu$ to 60 $\mu$.

It will be obvious that a structure like this one which endeavours to realize a small distance between the oppositely located edges of the two base zones is possible only to the extent in which the said base zones are subjected to voltages which do not differ much from each other. This is the case exactly in a photo-Dartington device.

On the other hand the device ensures that the base zones are separated by a groove outside the place occupied by the strip-shaped region. Said groove prevents any breakdown risk at voltages in the order of 1000 V and more throughout the zone of base-collector junctions surrounding the groove. (In this part of the device the structure actually is of the mesa type and the said junctions do not show a curved profile).

In addition to the advantage of high breakdown voltages, the device according to the invention has the additional advantage that the conductive connection between the emitter zone of the photo-transistor and the base zone of the amplifying transistor can easily be manufactured. Actually, the connection can be manufactured by providing a metal strip on the surface of the semiconductor plate, said being located on an insulating layer provided on the strip-shaped region of the first conductivity type which is provided between the two base zones. This means a very significant advantage relative to the structures according to the known method which are integrally of the mesa type and in which the said connection can be realized only by a wire.

According to a first preferred embodiment of a photo-Darlington device according to the invention the base zone of the photo-transistor and the base zone of the amplifying transistor are provided in the proximity of each other over a part of their respective circumference, the groove thus partly surrounding the base zones. According to the specific terms of semiconductor technology such a structure is determined as being of the mesa planar type; each transistor of the structure according to the invention is of the planar type over the part which is directed towards the other transistor and is of the mesa type over the outer part which is present near the circumferential groove.

According to a second preferred embodiment of the photo-Darlington device according to the invention, the base zone of the amplifying transistor surrounds the whole base zone of the photo-transistor. In this case the strip-shaped region of the first conductivity type separates the two base zones throughout the side length of the base zone of the phototransistor, while the circumferential groove is present on the outside of the base zone of the amplifying transistor. In this case the phototransistor in its entirety is of the "planar type" while the amplifying transistor is both of the "planar" and of the "mesa-type." The assembly formed by the two base-collector junctions of the phototransistor and the amplifying transistor, said junctions being polarized in the reverse direction at voltages which do not differ much from each other, behaves like a single flat junction of the mesa-type.

The importance of this second embodiment of the device according to the invention resides in the fact that the intensity of the leakage currents is reduced. Actually, transistors of the mesa-type show leakage currents which are larger than those of transistors of the planar type; it is therefore advantageous for the phototransistor to be of the planar type, since the leakage current of said transistor is amplified by the output transistor of the device.

Figure 2:
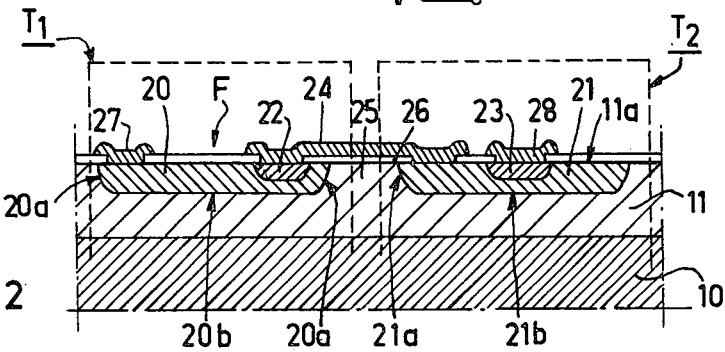
Figure 3:
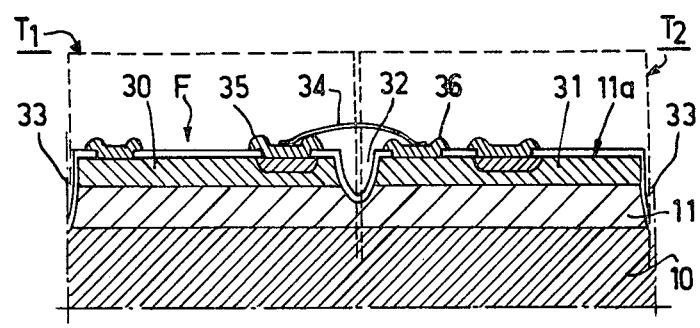
Figure 4:
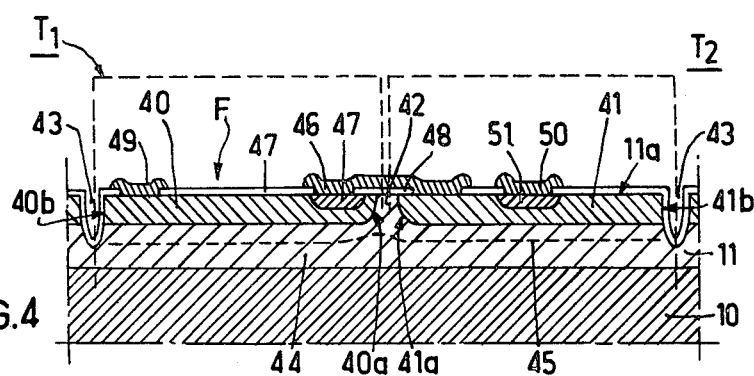
Figure 5:
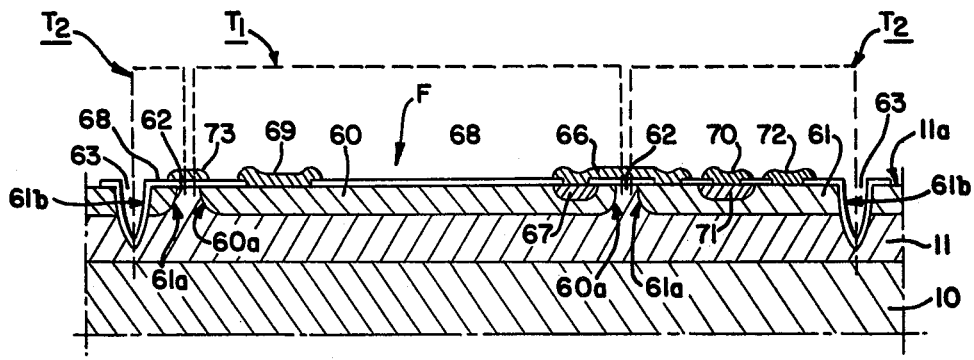
Figure 6:
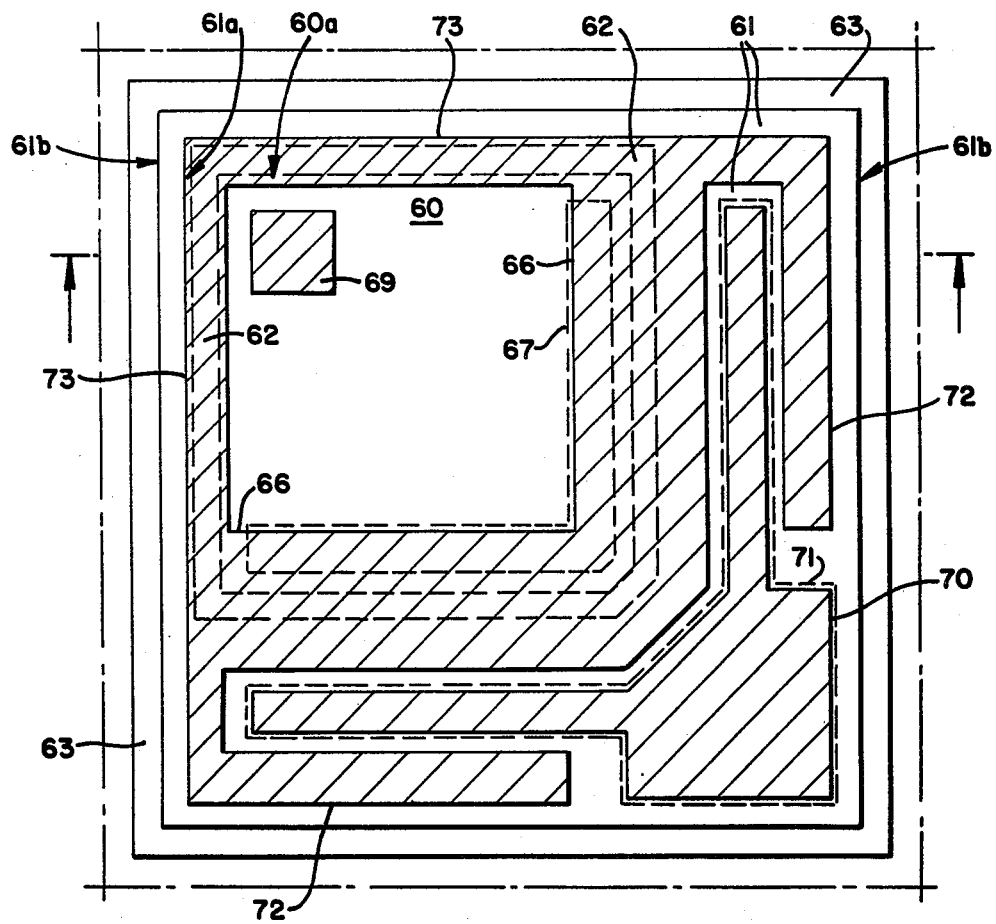

The invention will now be described in greater detail, by way of example, with reference to the accompanying drawings, in which:

FIG. 1 shows diagrammatically an amplifier of the Darlington-type,

FIG. 2 is a sectional view of a photo-Darlington device of the planar type obtained according to a known method, FIG. 3 is a sectional view of a photo-Darlington device of the mesa type obtained according to a known method, FIG. 4 is a sectional view of a first photo-Darlington device according to the invention, FIG. 5 is a sectional view taken on the line AA of FIG. 6 of a second photo-Darlington device according to the invention, FIG. 6 is a plan view of the photo-Darlington device shown in FIG. 5, FIGS. 7a to 7e are sectional views of the most important successive stages of the manufacture of a photo-Darlington device shown in FIGS. 5 and 6.

The figures are diagrammatic and not drawn to scale.

The photo-Darlington devices shown in FIGS. 2 to 7 each comprise a photo-transistor $T_1$ and an amplifying transistor $T_2$ corresponding to the two transistors of the Darlington amplifier diagram shown in FIG. 1. These devices are manufactured on a semiconductor substrate 10, for example for the $N^+$ conductivity type, the + sign indicating that the impurity concentration is comparatively large. An epitaxial layer 11 of the N-conductivity type covers the substrate 10; the impurity concentration in layer 11 is cover than that in the substrate 10. The layer 11 constitutes the common collector zone of the two transistors $T_1$ and $T_2$. By diffusions which were carried out from the upper surface 11a of the layer 11, the P-type base zones and the N-type emitter zones of the transistors were provided.

According to the known method, there exist two structural possibilities (see FIGS. 2 and 3). In the structure which corresponds to FIG. 2 and which is of the planar type, the base zones correspond to the zones 20 (phototransistor $T_1$) and 21 (amplifying transistor $T_2$), while within the boundaries of the said zones the respective zones 22 and 23 which form the emitter zones were also provided. The emitter zone of transistor $T_1$ is connected to the base zone of the transistor $T_2$ via a metal strip 24 which extends on the region 25 of the epitaxial layer 11 between the said zones 20 and 21; an insulating layer 26 of dielectric material ensures the insulation between the metal strip 24 and the said region 25. Furthermore, metallized zones 27 and 28 from the respective contacts on the base zone 20 of transistor $T_1$ and on the emitter zone 23 of transistor $T_2$.

The planar structure shown in FIG. 2 presents the possibility of an easy connection, via the metal strip 24, between the emitter zone of transistor $T_1$ and the base zone of transistor $T_2$. On the other hand, as already stated in the first part of this application, the configuration of the diffused base zones 20 and 21 shows considerably curved profiles in the proximity of the connection zones between the lateral edges 20a and the bottom 20b of the base zone 20 on the one hand and between the lateral edges 21a and the bottom 21b of the base zone 21 on the other hand; the result of this is that a strong electric field is formed in the said zones and that said field between the base zones and the collector zone prevents voltages from exceeding the order of magnitude of 300 Volts.

The mesa-type structure shown in FIG. 3 which has also been realized according to the known method has the advantage that the high-voltage behaviour thereof is much better than that of the structure corresponding to FIG. 2.

In the structure shown in FIG. 3 the two base zones 30, 31 initially formed part of the same diffused region. This region was separated into two halves by the grooves 32 while the assembly formed by the structure, as well as the base zones 30 and 31, were bounded at the circumference by the deeper groove 33. It will be obvious that the considerable edge curvature does no longer occur. It was proved experimentally that the elimination of the said edge curvature involves a better high-voltage behaviour. However, due to the presence of the groove 32, the direct conntection via a metal strip between the emitter zone of transistor $T_1$ and the base zone of transistor $T_2$ is no more possible; it is therefore necessary that the connection be realized by means of a wire 34 which bridges the groove 32 and which is welded on the metallized zone 35 which contacts the emitter zone of transistor T₁ and on the metallized zone 36 which contacts the base zone of transistor T₂.

The structure according to the invention, two modified embodiments of which are shown in FIG. 4 on the one hand and in FIGS. 5 and 6 on the other hand, shows the advantage of the two structures according to the above-described method without, however, exhibiting the drawbacks thereof.

According to the first embodiment (FIG. 4) of the photo-Darlington device according to the invention, the base zones 40, 41 (for example of the P-conductivity type) are formed as separate zones already during the diffusion. The base zones are provided in the proximity of each other along a part of their respective circumference; they are present opposite to each other over the part near their edges 40a and 41a.

According to the invention, the base zones 40 and 41 on the one hand are separated only by a strip-shaped region 42 of the n-conductivity type from the underlying epitaxial layer 11 between the oppositely located edges 40a and 41a, while on the other hand the base zones 40 and 41 along the whole remaining length of their edge, for example the parts 40b and 41b, are bounded by a groove 43 the depth of which reaches down to at least the layer 11.

The structure obtained in that manner is of the "mesa planar"-type: on the one hand it is of the mesa type due to the presence of the groove 43, on the other hand the said structure is of the planar type because the phototransistor T₁ and the transistor T₂ are not separated from each other by a groove.

As a result of this type of structure the base zones 40 and 41 show large edge curvatures only in the part of their oppositely located edges 40a and 41a. According to the invention, however, the separation strip is narrow; as a result of this the depletion zones of the base-collector junctions merge into each other when the collector-base voltage is sufficiently high. On the side of the collector zone 44 the depletion zone shows a substantially flat profile which is denoted by the broken line 45; this considerably reduces the danger of breakdown between the two base zones and the collector zones. Due to the fact that the risk of breakdown is also small along the groove 43, the structure according to the invention provides a considerably improvement with respect to the structure shown in FIG. 2 as regards the high voltage behaviour.

In contrast with the structure shown in FIG. 3, the structure shown in FIG. 4 permits realizing a conductive connection between the emitter zone 47 of the transistor T₁ and the base zone 41 of the transistor T₂ by means of a metal strip. Said metal strip 46 is insulated with respect to the underlying regions, which are bridged by the said strip, by means of a dielectric layer 48. This layer 48 partly protects the remainder of the active surface of the structure, namely on the one hand the zone where the radiation is incident and which is present at the surface of the base zone 40 opposite to the arrow F, and on the other hand the edges of the adjoining groove 43. As is the case in the structure shown in FIGS. 2 and 3, a metallized zone 49 is provided for the contact on the base zone 40 of the transistor T₁, and another metallized zone 50 on the emitter zone 41 of transistor T₂.

According to a second embodiment (FIGS. 5 and 6) of a photo-Darlington device according to the invention, the base zones 60 and 61 are provided in such manner that the base zone 61 of the transistor T₂ fully surrounds the base zone 60 of the photo-transistor T₁. According to the invention the base zones 60 and 61 on the one hand are separated from each other only by a strip-shaped region 62 of the underlying epitaxial layer 11 located between the oppositely located edges 60a and 61a, while on the other hand the base zones 60 and 61 are bounded by a groove 63 the depth of which reaches at least the epitaxial layer 11.

As was the case for the structure shown in FIG. 4, the connection between the emitter zone 67 of the photo transistor T₁ and the base zone 61 of the transistor T₂ is obtained by a metal strip 66 which is separated from the active surface of the structure by a dielectric layer 68. Said layer 68 further extends on the one hand at the surface of the base zone 60 of the phototransistor T₁, opposite to the arrow F which denotes the beam of radiation which impinges upon the said base zone 60, and on the other hand in the adjoining groove 63 where the said layer 68 fulfils a protective and passivating role. The contact on the base zone of transistor T₁ is represented by the metallized zone 69, while the metallized zone 70 forms the contact to the emitter zone of transistor T₂. The contact on the base zone of transistor T₂ is provided with conductive strips 72 which are connected to the metal strip 66.

Another conductive strip 73 which is also connected to the metal strip 66 follows the variation of the strip-shaped region 62 on the part which is not in the immediate proximity of the emitter zone 67 of transistor T₁ (that is to say the upper left-hand quarter in FIG. 6).

The conductive strip 73 fulfils the role of a field electrode and contributes to the depletion zones (which surround the base zones of the transistors T₁ and T₂) merging into each other in the part of the strip-shaped region 62 which is covered by the conductive strip 73. The assembly which is formed by the metal strip 66 and the conductive strips 72 and 73 constitutes the connection between the emitter zone of the photo-transistor T₁ and the base zone of the transistor T₂.

The manufacture of a photo-Darlington device the structure of which corresponds to the structures shown in FIGS. 5 and 6 will be described in detail hereinafter with reference to FIGS. 7a to 7e.

Starting material is a silicon plate 10, for example of the N+ conductivity type, havng a thickness of 250 $\mu$, said plate having an antimony doping and in this manner showing a resistivity in the order of magnitude of 0.01 ohm.cm. On a major surface 10a of the said plate an epitaxial layer 11 of the n-conductivity type is then provided, which layer is doped with phosphorus and has a resistivity of 40 ohm.cm (FIG. 7a), the thickness of the said layer being from 55 $\mu$ to 65 $\mu$.

Figure 7A:
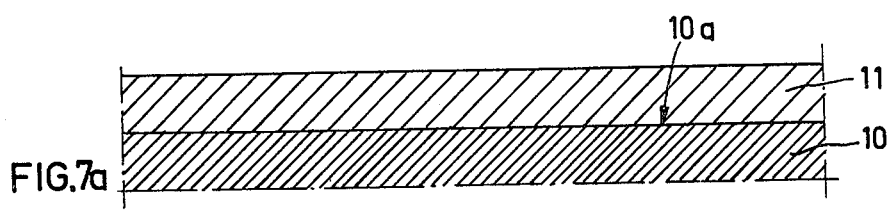
Figure 7B:
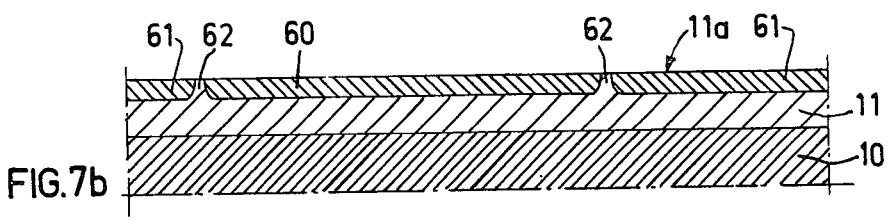

From the upper surface 11a of the layer 11 a localized diffusion of boron is then carried out so as to form the P-type base zone 60 of the phototransistor T₁ and also to form the base zone of the same conductivity type of the amplifying transistor T₂. The surface resistance in the said base zones whose thickness is from 5 $\mu$ to 8 $\mu$ is equal to 100 to 200 ohm per square (FIG. 7b).

Figure 7C:
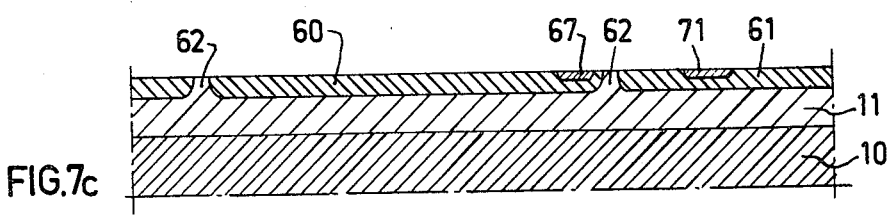

The formation of the base zones 60 and 61 is succeeded by that of the emitter zone 67 of transistor T₁, the emitter zone 67 beng obtained by a phosphorus diffusion and the surface resistance in the zones 67 and 71 being from 2 to 10 ohm per square; the achieved diffusion depth is from 3 $\mu$ to 6 $\mu$ (FIG. 7c).

Figure 7D:
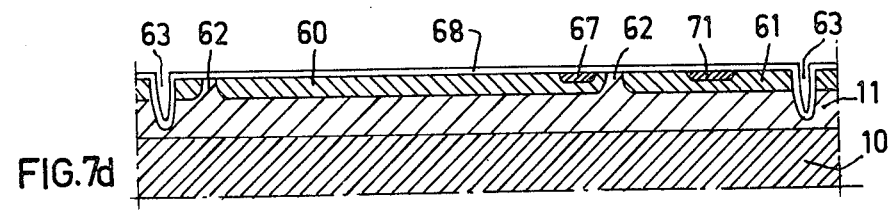
Figure 7E:
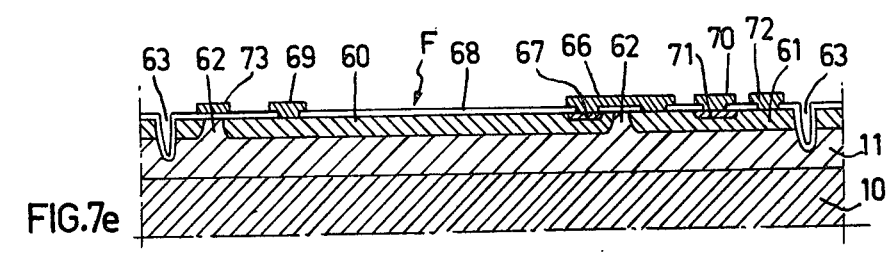

The groove 63 is then formed with a depth of from 30 $\mu$ to 120 $\mu$. In this stage, the structure obtained so far is covered with a passivating silicon oxide layer 68. The thickness of said layer 68 is from 1 $\mu$ to 3 $\mu$ (FIG. 7d).

Finally the contact windows are provided in the layer 68 on the base zone 60 and on the emitter zone 67 of the phototransistor $T_1$ and also on the base zone 61 and on the emitter zone 71 of the transistor $T_2$, after which the metal layers and metal strips 69, 70 and 72 are formed by vapour-deposition and etching, for example, of aluminium.

The numerical values given in the preceding example apply to a photo-Darlington device which can withstand collector-base voltages of the order of 600 Volts. For the width of the strip-shaped region 62, measured at the surface 11a of the layer 11, a suitable value then is 20 $\mu$ (19 $\mu$ to 21 $\mu$).

It will be obvious that for devices having different collector-base voltages, the above-mentioned values may be varied within wide limits, in particular the values of the thickness and the resistivity of the layer 11, the depth of the groove 63 and the width of the region 62.

Moreover the invention is not restricted to the embodiments described in this specification in which npn-transistors are used. The invention also relates to the case in which pnp-transistors are used.

What is claimed is:

1. A semiconductor device having at least two transistors comprising:
   (a) a semiconductor body containing said transistors,
   (b) said transistors comprising respective emitter and base zones, said emitter zones being of a first conductivity type and said base zones being of a second conductivity type, said transistors further comprising a common collector zone of said first conductivity type, said base zones of said transistors being provided in said common collector zone and comprising oppositely located edges, said base zones forming respective junctions with said collector zone and being separated over at least a part of their oppositely located edges by a strip-shaped region of semiconductor material that is of said first conductivity type and that has a width adapted such that in the operating condition of said transistors the depletion zones of the respective base-collector junctions of said transistors merge into each other,
   (c) a groove located in said semiconductor body and bounded by a wall that bounds said base zones at their respective parts located beyond said strip-shaped region and throughout the remaining part of their edges, said groove having a greater depth than said base-collector junctions.

2. A semiconductor device as in claim 1, wherein said stripshaped region of said first conductivity type occupies the whole zone between said oppositely located edges of said base zones.

3. A semiconductor device as in claim 1, wherein said device forms a photo-Darlington device in which a first said transistor comprises a phototransistor coupled to a second said transistor comprising an amplifying transistor, said two transistors being of the same conductivity type, said emitter zone of said phototransistor being conductively connected to said base zone of said amplifying transistor by a conductive connection between said phototransistor emitter zone and said amplifying transistor base zone, said device further comprising an insulating layer provided on said strip-shaped region and said conductive connection being disposed on said insulating layer.

4. A semiconductor device as in claim 3, wherein said base zones of said phototransistor and said amplifying transistor are located beside each other and said groove partly surrounds each of said base zones.

5. A semiconductor device as in claim 3, wherein said base zone of said phototransistor is surrounded along its whole edge by said base zone of said amplifying transistor and is separated therefrom by said strip-shaped region, said groove surrounding entirely said base zone of said amplifying transistor.

6. A semiconductor device as in claim 5, wherein said conductive connection entirely covers said strip-shaped region.

7. A semiconductor device as in claim 6, wherein the width of said strip-shaped region measured at the surface, is at least 10 $\mu$m and at most 60 $\mu$.

8. A semiconductor device as in claim 7, wherein collector zone is formed by an n-type conductive epitaxial silicon layer having a resistivity of 40 ohm-cm and a thickness of at least 55 $\mu$ and at most 65 $\mu$, said device comprising an n-type silicon substrate having a resistivity of about 0.01 ohm-cm, and said epitaxial layer being disposed on said substrate, said base zones of said phototransistor and amplifying transistor comprising diffused regions of p-type conductivity and having a surface resistance between 100 ohm and 200 ohm per square and a depth of at least 5 $\mu$ and at most 8 $\mu$, the width of said strip-shaped region at the surface being at least 19 $\mu$ and at most 21 $\mu$ and the diffused said emitter zones of said phototransistor and amplifier transistor having a surface resistance between 2 ohm and 10 ohm per square, the depth of said adjoining groove being between 30 $\mu$ and 120 $\mu$.

* * * * *

UNITED STATES PATENT OFFICE
CERTIFICATE OF CORRECTION

Patent No. 4,078,244   Dated March 7, 1978

Inventor(s) MAURICE BONIS

It is certified that error appears in the above-identified patent and that said Letters Patent are hereby corrected as shown below:

Column 2, line 38, delete "preferably" and insert

--preferably-- after "device,"

line 67, after "said" insert --strip--

Column 4, line 10, "cover" should be --lower--

Signed and Sealed this

Ninth Day of January 1979

[SEAL]

Attest:

RUTH C. MASON
*Attesting Officer*

DONALD W. BANNER
*Commissioner of Patents and Trademarks*